(12) United States Patent
Tous et al.

(10) Patent No.: US 9,496,432 B2
(45) Date of Patent: Nov. 15, 2016

(54) METHOD FOR FORMING METAL SILICIDE LAYERS

(71) Applicants: IMEC, Leuven (BE); K.U.Leuven R&D, B-Leuven (BE); Excico Group NV, Hasselt (BE)

(72) Inventors: Loic Tous, Mespaul (FR); Monica Aleman, Etterbeek (BE); Joachim John, Freiburg (DE); Thierry Emeraud, Hasselt (BE)

(73) Assignees: IMEC, Leuven (BE); Katholieke Universiteit Leuven, Leuven (BE); Excico Group NV, Hasselt (BE)

( * ) Notice: Subject to any disclaimer, the term of this patent is extended or adjusted under 35 U.S.C. 154(b) by 0 days.

(21) Appl. No.: 14/360,580

(22) PCT Filed: Nov. 23, 2012

(86) PCT No.: PCT/EP2012/073510
§ 371 (c)(1),
(2) Date: May 23, 2014

(87) PCT Pub. No.: WO2013/076267
PCT Pub. Date: May 30, 2013

(65) Prior Publication Data
US 2014/0335646 A1 Nov. 13, 2014

Related U.S. Application Data

(60) Provisional application No. 61/563,433, filed on Nov. 23, 2011.

(51) Int. Cl.
*H01L 31/0236* (2006.01)
*H01L 21/268* (2006.01)
(Continued)

(52) U.S. Cl.
CPC ....... *H01L 31/02366* (2013.01); *H01L 21/268* (2013.01); *H01L 21/32053* (2013.01); *H01L 31/02168* (2013.01); *H01L 31/022425* (2013.01); *H01L 31/1864* (2013.01); *Y02E 10/50* (2013.01); *Y02P 70/521* (2015.11)

(58) Field of Classification Search
CPC ............. H01L 21/268; H01L 21/32053; H01L 31/02168; H01L 31/022425; H01L 31/02366; H01L 31/1864
See application file for complete search history.

(56) References Cited

U.S. PATENT DOCUMENTS

2007/0066039 A1\* 3/2007 Agarwal ............. H01L 21/0485
438/534
2007/0237475 A1\* 10/2007 Morita et al. ................. 385/115
(Continued)

FOREIGN PATENT DOCUMENTS

| EP | 2 290 128 | 3/2011 |
|---|---|---|
| WO | WO 2010/115763 | 10/2010 |

OTHER PUBLICATIONS

Leet et al (Setiawan, Y.; Lee, Pooi See; Pey, Kin Leong; Wang, X. C.; Lim, G. C.; Chow, F. L., "Nickel silicide formation using multiple-pulsed laser annealing", published online Feb. 8, 2007).\*

(Continued)

*Primary Examiner* — Khaja Ahmad
(74) *Attorney, Agent, or Firm* — Levy & Grandinetti

(57) ABSTRACT

The present invention is related to a method for forming a metal silicide layer on a textured silicon substrate surface. The method includes providing a metal layer on a textured silicon substrate and performing a pulsed laser annealing step providing at least one UV laser pulse with a laser fluence in the range between 0.1 J/cm$^2$ and 1.5 J/cm$^2$ and with a laser pulse duration in the range between 1 ns and 10 ms. Then, the method includes converting at least part of the metal layer into a metal silicide layer. In addition, the present (Continued)

invention is related to the use of such a method in a process for fabricating a photovoltaic cell, wherein the dielectric layer is a surface passivation layer, or wherein the dielectric layer is an antireflection coating.

16 Claims, 2 Drawing Sheets

(51) Int. Cl.
  *H01L 21/3205* (2006.01)
  *H01L 31/0216* (2014.01)
  *H01L 31/0224* (2006.01)
  *H01L 31/18* (2006.01)

(56) References Cited

U.S. PATENT DOCUMENTS

| | | | |
|---|---|---|---|
| 2008/0099769 A1* | 5/2008 | Rupp | H01L 21/0495 257/77 |
| 2009/0223549 A1 | 9/2009 | Ounadjela et al. | |
| 2011/0272009 A1* | 11/2011 | Cabral et al. | 136/255 |
| 2012/0091589 A1* | 4/2012 | Cabral, Jr. | H01L 21/28518 257/754 |
| 2013/0062619 A1* | 3/2013 | Henning et al. | 257/77 |

OTHER PUBLICATIONS

Lue, J. et al., "Formation of nickel and palladium silicides by a short-pulse light-flash . . .," 26(8) Solid-State Electronics 787-93 (1983).

Tamir, S. et al., "Laser-induced nickel silicide formation," 202(2)Thin Solid Films 257-66 (Jul. 30, 1991).

Knorz, A. et al., "Selective Laser Ablation of SiNx Layers on Textured Surfaces . . .," 17(2) Progress in Photovoltaics: Research and Applications 127-36 (2009).

Tous, L. et al., "Nickel silicide formation using excimer laser annealing," 27 Energy Procedia 503-09 (2012).

Sinton, R.A. et al., "A Quasi-Steady-State Open-Circuit Voltage Method for Solar Cell Characterization," 16th European Photovoltaic Solar Energy Conference, Glasgow, UK, 2000.

* cited by examiner

METHOD FOR FORMING METAL SILICIDE LAYERS

This Application is the U.S. National Phase of International Application Number PCT/EP2012/073510 filed on Nov. 23, 2012, which claims priority to U.S. Patent Application No. 61/563,433 filed on Nov. 23, 2011.

FIELD OF THE INVENTION

The disclosed technology relates to a method of forming metal silicide layers, and more in particular, a method of forming patterned metal silicide layers in a metallization process for silicon photovoltaic cells.

BACKGROUND

The current industrial standard processes for front side metallization of silicon photovoltaic cells are based on printing of silver pastes or inks that need to be fired for good contact formation. Traditional screen printing of silver pastes is limited to emitters having a sheet resistance in the order of 60 to 90 Ohm/square, with an emitter surface concentration above $10^{20}$ at/cm$^3$ to allow sufficient Ag crystallite formation.

Due to their excellent contact properties, nickel silicide layers can be used for forming good contacts on lowly doped emitters with a surface concentration lower than $10^{20}$ at/cm$^3$. Nickel silicide layers can be formed by providing a thin nickel layer (e.g. by electroless plating) on a silicon surface, followed by an annealing or sintering step to induce silicidation, resulting in the formation of a nickel-silicon alloy (nickel silicide). The annealing step is typically done in an inert environment (e.g. $N_2$) by rapid thermal annealing (RTA) or in a belt firing furnace.

The main challenge related to nickel silicide formation on top of an emitter junction is avoiding shunting of the emitter junction. Shunting may result from nickel diffusion into the silicon during the silicidation process.

In a process for fabricating photovoltaic cells, a patterned nickel silicide layer can be formed at the front side of the cells in openings created in an antireflection coating. On top of the nickel silicide layer at least one additional metal layer (such as a Cu layer) is typically electroplated (using the nickel silicide layer as a seed layer) to form low resistance contact paths. In an industrial fabrication process, the openings in the antireflection coating are typically formed by laser ablation, e.g. using a ps UV laser. Such a laser ablation step creates defects or damage to the silicon surface, enhancing the risk of nickel diffusion during a subsequent silicidation process and thus an increased risk of emitter shunting, e.g. due to nickel spiking.

On textured silicon surfaces, increased laser ablation occurs at the pyramid tips and edges, as reported by A. Knorz et al in "Selective Laser Ablation of SiN$_x$ Layers on Textured Surfaces for Low Temperature Front Side Metallizations", Prog. Photovolt: Res. Appl. 2009, 17, 127-136. It was shown that under irradiation with laser light with a wavelength of 355 nm a textured surface causes local amplifications of the electromagnetic field, leading to an inhomogeneous irradiation of the surface and therefore preventing a completely damage free laser ablation of the antireflection coating.

SUMMARY OF THE INVENTION

Certain inventive aspects relate to a method for forming a patterned metal silicide layer, e.g. nickel silicide layer, on a surface of a silicon substrate, wherein the risk of metal, e.g. nickel, spiking is avoided or substantially reduced as compared to prior art methods. A method according to one inventive aspect can be applied on a textured silicon surface, such as a textured surface of a photovoltaic cell, without substantially damaging the surface texture. In one aspect, a method can advantageously be used for selectively forming electrical contacts at the front side of a photovoltaic cell, e.g. in openings created in a dielectric layer, e.g. an antireflection coating, even when such openings are created by means of laser ablation, and without deteriorating the surface passivation quality of the dielectric layer.

In one aspect, a method for forming a patterned metal silicide layer on a silicon substrate comprises: providing a metal layer on a textured silicon substrate; and performing a pulsed laser annealing step providing at least one UV laser pulse with a laser fluence in the range between 0.1 J/cm$^2$ and 1.5 J/cm$^2$ and with a laser pulse duration in the range between 1 ns and 10 ms, thereby converting at least part of the metal layer into a metal silicide layer.

In one aspect, a method for forming a patterned metal silicide layer on a silicon substrate comprises: providing a dielectric layer on the silicon substrate; forming openings through the dielectric layer at locations where a metal silicide layer needs to be formed; providing a thin metal layer comprising the metal on the substrate, at least at the location of the openings; and performing a pulsed laser annealing step using an UV laser, with a laser fluence in the range between about 0.1 J/cm$^2$ and 1.5 J/cm$^2$, particularly between about 0.3 J/cm$^2$ and 0.7 J/cm$^2$, thereby converting at least part of the metal layer into a metal silicide layer. The metal can for example be Ni, Co, Ti, TiW or Pt.

In one aspect, the metal is nickel and the metal silicide layer is a nickel silicide layer.

In one aspect, a single laser pulse is used, with a pulse duration in the range between about 1 ns and 10 ms, for example between about 1 ns and 1 ms, particularly between about 1 ns and 250 ns.

Without being bound by any theory, using one pulse excimer laser annealing at appropriate energy density value with appropriate pulse length may generate a melt of silicon substrate under a metal layer, and create a metal silicide in the melted region only.

The laser beam spot size may be in the range between about 2 mm×2 mm and 10 cm×10 cm, such as about 1 cm×1 cm. However, the present disclosure is not limited thereto. For example, multiple laser pulses can be used and/or the laser beam spot size can be larger than 10 cm×10 cm (e.g. equal to or larger than the substrate size) or smaller than 2 mm×2 mm. A step-and-scan approach can be used for irradiating the entire substrate surface. For example, a system as described in WO 2010/115763 can be used for performing the laser annealing step at high throughput.

After performing the laser annealing step, an etch step is performed for removing unreacted metal, e.g. unreacted nickel. The etch step can for example comprise etching in a wet etching solution comprising HNO$_3$, H$_2$O$_2$:H$_2$SO$_4$ or HCl:HNO$_3$ or any other suitable etching solution known by a person skilled in the art. This etch step is followed by at least one plating step, thereby e.g. forming a Ni/Cu stack or a Ni/Cu/Ag stack or a Ni/Cu/Sn stack or any other suitable stack known to a person skilled in the art on top of the metal silicide layer.

In one aspect, the dielectric layer provided on the silicon substrate can be a single dielectric layer, such as a SiN$_x$, SiO$_2$ or AlO$_x$ layer, or a stack comprising at least two dielectric layers, such as a SiO$_2$/SiN$_x$ stack or an AlO$_x$/SiN$_x$ stack. In a photovoltaic cell, the dielectric layer or dielectric layer stack can provide surface passivation and/or can function as an antireflection coating.

In one aspect, forming openings through the dielectric layer can for example be done by laser ablation. However, the present disclosure is not limited thereto and other suitable methods can be used. For example, forming openings through the dielectric layer can comprise providing a patterned masking layer (such as by ink jet printing) followed by wet etching of the dielectric layer.

In one aspect, providing a thin metal layer can be done by any suitable method known to a person skilled in the art, such as, by physical vapor deposition (PVD) or preferably by plating, for example electroless plating, electroplating, light induced electroless plating (LIEP), or even more preferably light induced plating.

The thickness of the thin metal layer can be in the range between about 1 nm and 2000 nm, particularly between about 10 nm and 200 nm, more particularly between about 20 nm and 100 nm, and preferably between about 40 nm and 50 nm.

It is an advantage of a method in one aspect that the risk of emitter junction shunting is avoided or substantially reduced as compared to prior art methods, even on a surface damaged by laser ablation.

It is an advantage of a method in one aspect that surface damage due to laser ablation may be cured.

It is an advantage of a method in one aspect that a better thickness control over the photovoltaic cells may be achieved.

It is an advantage of a method in one aspect that controlled formation of mono-silicide NiSi is enabled within one step.

It is an advantage of a method in one aspect that the laser fluences are in a suitable range to perform the method on a textured surface without substantially damaging the surface texture.

It is an advantage of a method in one aspect that the surface passivation quality of the dielectric layer is substantially maintained, such that there is no need for alignment of the laser irradiation beam to the openings formed in the dielectric layer.

It is an advantage of a method in one aspect that the duration of the laser pulses is very short, leading to reduced oxidation effects, thereby avoiding the need to work in an inert environment.

It is an advantage of a method in one aspect, e.g. when used for the formation of front side contacts of a photovoltaic cell, that the substrate is only heated at the front side, thus for example enabling the use of temperature-sensitive surface passivation layers such as amorphous silicon or $AlO_x$ at the rear side of the cell.

It is an advantage of a method in one aspect that it can be performed with high throughput, e.g. in an industrial environment.

Certain objects and advantages of various inventive aspects have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein. Further, it is understood that this summary is merely an example and is not intended to limit the scope of the disclosure. The disclosure, both as to organization and method of operation, together with features and advantages thereof, may best be understood by reference to the following detailed description when read in conjunction with the accompanying drawings.

DETAILED DESCRIPTION

In the context of the present description, the front surface or front side of a photovoltaic cell is the surface or side adapted for being oriented towards a light source and thus for receiving illumination. The back surface, back side, rear surface or rear side of a photovoltaic cell is the surface or side opposite to the front surface. The front side of a substrate is the side of the substrate corresponding to the front side of the photovoltaic cell to be fabricated, while the rear side or back side of the substrate corresponds to the back side of the photovoltaic cell to be fabricated.

Certain embodiments relate to a method for forming a patterned metal silicide layer on a silicon substrate, the method comprising: providing a dielectric layer on the silicon substrate; forming openings through the dielectric layer at locations where a metal silicide layer needs to be formed; providing a thin metal layer comprising the metal on the substrate, at least at the location of the openings; and performing a pulsed laser annealing step using an UV laser, with a laser fluence in the range between about 0.1 $J/cm^2$ and 1.5 $J/cm^2$, particularly between about 0.3 $J/cm^2$ and 0.7 $J/cm^2$, thereby converting at least part of the metal layer into a metal silicide layer. In one embodiment, a single laser pulse is used, with a pulse duration in the range between about 1 ns and 10 ms, for example between about 1 ns and 1 ms, preferably between 1 ns and 250 ns, and with a laser beam spot size in the range between about 2 mm×2 mm and 10 cm×10 cm, such as about 1 cm×1 cm.

The method is further described for embodiments wherein the metal is nickel and wherein the metal silicide layer is a nickel silicide layer. However, the present disclosure is not limited thereto. Other metals can be used such as Co, Ti, TiW or Pt and other metal silicides can be formed.

The method is further described for an illustrative embodiment wherein a patterned nickel silicide layer is provided as part of the front side metallization process of a photovoltaic cell. However, the present disclosure is not limited thereto and the method can also be used for providing contacts to the rear side of a photovoltaic cell.

The method can be used in a fabrication process for different types of photovoltaic cells, such as back contact cells, metal wrap Through cells, emitter wrap through cells, back junction cells, Interdigitated back contact cells, and bifacial cells.

Figure 1A:
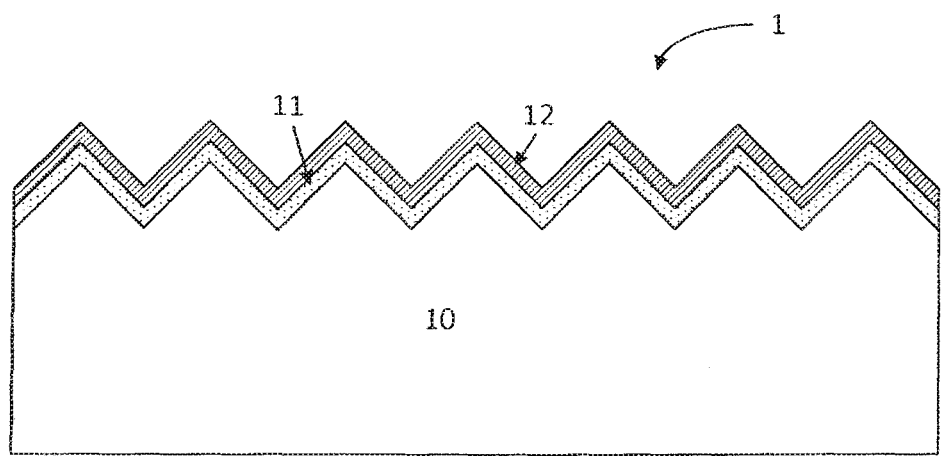
FIG. 1(a) illustrates a cross sectional view of a dielectric layer or dielectric stack provided on the textured front side of a substrate.

A method in accordance with one embodiment is schematically illustrated in FIGS. 1(a), 1(b), 1(c), and 1(d), wherein the method is used for forming front side metal contacts of a photovoltaic cell. In the example shown, a substrate 10 of a first conductivity type (e.g. p-type) having a textured front surface 1 is used. At the front side an emitter region 11 having a second doping type (e.g. n-type) opposite to the first doping type is provided. As illustrated in FIG. 1(a), a dielectric layer or a dielectric stack 12 is provided on the textured front side 1 of the substrate. The dielectric layer or dielectric stack 12 can for example comprise a silicon nitride layer. It functions as a front surface passivation layer and preferably also as an antireflection coating in the final device. Other dielectric layer materials may be silicon oxide or aluminium oxide.

Figure 1B:
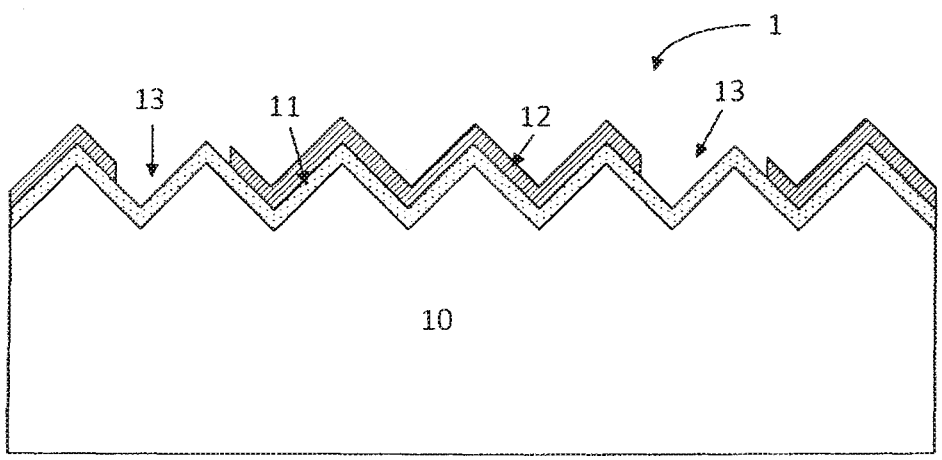
FIG. 1(b) illustrates a cross sectional view of a substrate after the formation of openings through the dielectric layer.

Next, at least one opening 13 is formed, e.g. by laser ablation, through the dielectric layer or dielectric stack 12 such that the emitter region 11 is locally exposed at locations where a nickel silicide contact layer needs to be formed in a later phase of the process. FIG. 1(b) schematically shows a cross section after formation of openings 13 through the dielectric layer 12.

Figure 1C:
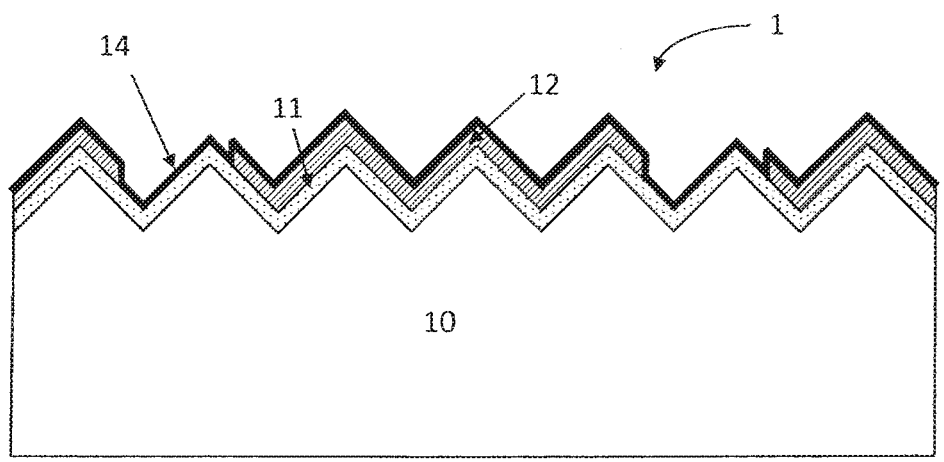
FIG. 1(c) illustrates a cross sectional view of a substrate after a thin nickel layer is provided at the front surface.
Figure 1:
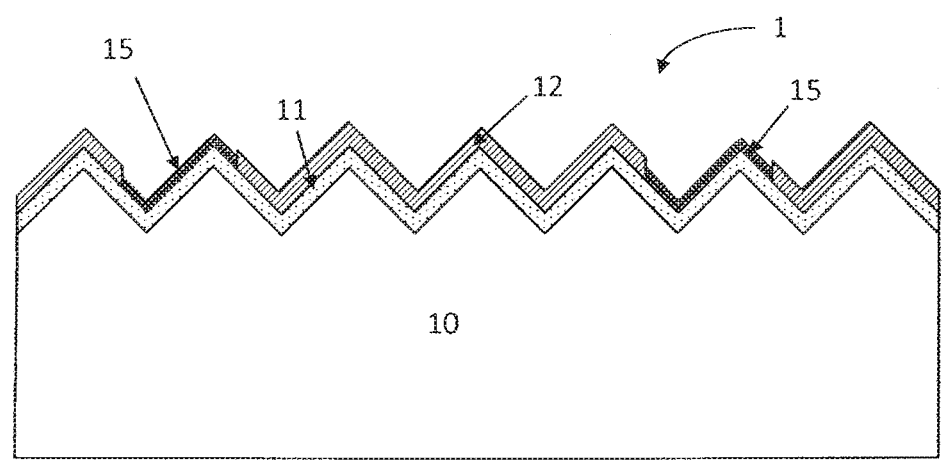
FIG. 1(d) illustrates a cross sectional view after an etching step is performed to remove unreacted nickel.

Next a thin nickel layer 14 is provided at the front side 1, at least at the location of the openings 13. For example, the thin nickel layer 14 can be provided at the entire front surface 1, e.g. by PVD or by electroplating, as illustrated in FIG. 1(c). Other plating methods for providing a nickel layer can be used, such as light induced plating, in which case a nickel layer is only present at the location of the openings 13 (not illustrated). In preferred embodiments the thickness of the nickel layer is in the range between 20 nm and 100 nm. However, the present disclosure is not limited thereto, and thinner or thicker nickel layers can be used.

After providing the nickel layer 14 a pulsed laser annealing step using an UV laser is done in accordance with one embodiment, thereby converting at least part of the nickel layer 14 at locations where the nickel layer is in contact with the silicon (i.e. at the location of the openings 13) into a nickel silicide layer 15. Preferably a single laser pulse is used having a relatively large beam spot size, e.g. substantially larger than a width of the openings 13, thereby avoiding the need for alignment of the laser beam to the openings 13. A step-and-scan approach can be used for irradiating the whole substrate surface.

Next an etching step is performed to remove unreacted nickel. A cross section of the resulting structure is schematically shown in FIG. 1(d).

In a method for fabricating photovoltaic cells, this step can be followed by a plating step (in case the nickel metal layer was deposited by a first plating step, this plating step is a second one), using the nickel silicide layer 15 as a seed layer. In a method for fabricating photovoltaic cells, a rear side passivation layer and rear side metal contacts can be provided, e.g. before forming the at least one opening 13. However, the present disclosure is not limited to this process sequence, and any suitable process sequence can be used.

Nickel silicide layers were formed in accordance with one embodiment on textured silicon substrates covered with a 75 nm thick $SiN_x$ a layer. After forming 10 micrometer wide, line-shaped openings in the $SiN_x$ a layer by ps laser ablation, a 40 nm thick nickel layer was deposited by PVD. In the experiments, a XeCl Excimer laser with 308 nm wavelength was used for irradiating the nickel layer and inducing silicidation. A single 150 ns laser pulse covering an area of 1 cm×1 cm was used to convert at least part of the 40 nm thick nickel layer into a nickel silicide layer. The entire substrate area was irradiated using a step-and-scan approach by providing 1 cm×1 cm pulses next to each other with a small overlap.

In a first series of experiments, the pulse fluence was varied and the effect of the laser irradiation on the surface texture and on the surface passivation quality of the $SiN_x$ a layer was investigated. From the experiments it was concluded that, in order to avoid damage to the surface texture, the laser fluence is preferably selected to be in a range wherein silicon melting is avoided or limited (e.g. only rounding of pyramid tips). Simulations show that the preferred laser fluence may also be influenced by the thickness of the nickel layer, because the thickness of the nickel layer has an effect on the reflectivity of the irradiated surface. For example, for a nickel layer thickness of 20 nm a laser fluence up to 1 J/cm$^2$ can be used without damaging the surface texture. For a nickel layer thickness in the range between 50 nm and 100 nm the surface reflectivity is reduced (as compared to the case of a 20 nm thick nickel layer), and preferably a lower laser fluence is used, e.g. in the order of 0.5 J/cm$^2$. For thicker nickel layers, such as in the range between 500 nm and 2000 nm higher laser fluences are needed because more heat is absorbed in the nickel layer. However, these higher laser fluences are preferably avoided because they may damage the surface passivation quality of the $SiN_x$ a layer.

Based on $V_{oc}$-Photolimunescence imaging it was observed that damage to the passivation quality of the $SiN_x$ a layer can be avoided by performing the laser annealing step at a fluence lower than 0.7 J/cm$^2$.

Photovoltaic cells were fabricated using a method in accordance with one embodiment for forming the front side contacts. After texturing both sides of monocrystalline p-type CZ silicon substrates, the rear side was polished, and the substrates were cleaned. A POCl$_3$ diffusion step was performed for forming an emitter junction at the front side. After PSG (phosphosilicate glass) removal and cleaning, an emitter drive-in step was performed for 30 minutes at 920° C., resulting in a 600 nm deep emitter with a sheet resistance of 120 Ohm per square. This step was followed by etching in HF and deposition of a $SiN_x$:H antireflection coating at the front side of the substrates. Next an Al paste was screen printed on the rear side and a firing step was done to create an Al BSF at the entire rear surface of the substrates. Openings were formed in the $SiN_x$:H antireflection coating by ps laser ablation, at locations where front contacts were to be provided. A 40 nm thick Ni layer was then deposited on the entire front surface. For a first group of cells, a standard Rapid Thermal Annealing step was then performed at 275° C. for 30 seconds to induce silicidation. For a second group of cells a XeCl laser annealing step in accordance with one embodiment was done. This was followed by selective etching of unreacted Ni, and Ni/Cu/Ag plating.

Based on suns-photoluminescence imaging of the second group of cells, no damage was observed to the surface passivation quality of the $SiN_x$ layer for a XeCl laser fluence of 0.55 J/cm$^2$. However, for higher fluences a degradation of the passivation quality was observed. For laser fluences higher than 0.7 J/cm$^2$ increasing passivation damage was observed for increasing laser fluences.

The measured current-voltage characteristics of photovoltaic cells are shown in Table 1 for the first group of cells wherein the silicidation was induced by rapid thermal annealing ('RTA' in Table 1) for 30 seconds at 275° C. and for cells from the second group wherein silicidation was induced by laser annealing according to one embodiment using a laser fluence of 0.55 J/cm$^2$ ('laser' in Table 1). Table 1 shows the measured short-circuit density $J_{sc}$, open-circuit voltage $V_{oc}$, fill factor FF, pseudo fill factor pFF (as described by R A. Sinton et al in "A quasi-steady-state open-circuit voltage method for solar cell characterization", Proceedings of the 16th EPVC, Glasgow, 2000), energy conversion efficiency and shunt resistance $R_{shunt}$.

TABLE 1

| | size [cm$^2$] | $J_{sc}$ [mA/cm$^2$] | $V_{oc}$ [mV] | FF [%] | pFF [%] | η [%] | $R_{shunt}$ [Ω cm$^2$] |
|---|---|---|---|---|---|---|---|
| RTA | 148.25 | 36.57 | 627.8 | 73.2 | 78.3 | 16.81 | 3540 |
| laser | 148.25 | 36.50 | 625.7 | 76.3 | 84.0 | 17.42 | 1980 |

From the results it can be concluded that XeCl laser annealing at 0.55 J/cm$^2$ results in an open-circuit-voltage $V_{oc}$ and a short-circuit density $J_{sc}$ in the same order of the $V_{oc}$ and $J_{sc}$ obtained with standard RTA anneal.

Further, it was observed that XeCl laser annealing at 0.55 J/cm$^2$ leads to a reduced diode damage (higher pFF) as compared to standard RTA annealing.

The results in Table 1 show poor FF and pFF values for the RTA sample. This is related to rapid diffusion of nickel through defects created during laser ablation of the antireflection coating, leading to spiking of the undeep emitter junction used in these experiments (600 nm deep, 120 Ohm per square). Using Rapid Thermal Annealing for the silicidation process would require the use of a deeper emitter (e.g. more than 1 micrometer deep) in order to prevent diode damage.

Table 2 shows measured current-voltage characteristics of photovoltaic cells wherein a 40 nm thick nickel layer was laser annealed in accordance with one embodiment, for different laser fluences (0.90 J/cm$^2$, 0.70 J/cm$^2$ and 0.55 J/cm$^2$) used in the nickel silicidation process.

TABLE 2

| laser fluence | size [cm$^2$] | $J_{sc}$ [mA/cm$^2$] | $V_{oc}$ [mV] | Suns_$V_{oc}$ [mV] | FF [%] | pFF [%] | η [%] | $R_{shunt}$ [Ω cm$^2$] |
|---|---|---|---|---|---|---|---|---|
| 0.90 J/cm$^2$ | 25 | 26.80 | 589.7 | 566.0 | 57.5 | 63.3 | 9.09 | 8.64 × 10$^3$ |
| 0.70 J/cm$^2$ | 25 | 35.00 | 621.0 | 622.5 | 74.9 | 83.4 | 16.28 | 3.33 × 10$^3$ |
| 0.55 J/cm$^2$ | 25 | 36.21 | 630.3 | 631.0 | 80.0 | 82.1 | 18.24 | 2.75 × 10$^7$ |

The results show that for XeCl laser annealing at 0.7 J/cm$^2$ and especially at 0.9 J/cm$^2$ there is a drop in $J_{sc}$ as compared to cells with XeCl laser annealing at 0.55 J/cm$^2$. This may be related to ghost plating due to NiSi$_x$ formation via SiN$_x$ a pinholes. The passivation damage at higher XeCl laser fluences is clearly reflected in the measured $V_{oc}$ values. At a laser fluence of 0.90 J/cm$^2$ a strong pFF drop to 63.3% is observed, which may be related to diode damage resulting from spiking of the emitter junction. For XeCl laser annealing at 0.55 J/cm$^2$ good contact properties are obtained, as well as a good fill factor.

A further analysis was performed for samples of textured silicon covered with a 40 nm thick PVD Ni layer that was laser annealed at different fluences. Unreacted Ni was removed by means of a SPM mixture. Three different laser fluences were used in the silicidation process: 0.56 J/cm$^2$, 0.71 J/cm$^2$ and 0.94 J/cm$^2$.

Based on SEM pictures it was observed that for samples annealed at 0.56 J/cm$^2$, the pyramids of the surface texture have a pointed top (i.e. no texture damage), whereas for the samples annealed at the higher fluences the pyramid tops are more rounded. It was also observed that the silicide layer has a variable thickness. It is thinner at the bottom part of the pyramid sidewalls as compared to the top part of the pyramids.

An EDS (energy-dispersive X-ray spectroscopy) quantification of the nickel silicide layers was performed. The following Si/Ni compositions were measured:

laser fluence 0.56 J/cm$^2$: Si/Ni: 52/48, indicating the presence of the NiSi phase;

laser fluence 0.71 J/cm$^2$: Si/Ni: 48/52, 51/49, 44/55, 47/53, also indicating the presence of mainly the NiSi phase;

laser fluence 0.94 J/cm$^2$: Si/Ni: 63/37, 68/32, 58/42, indicating the presence of a NiS$_2$ phase having a higher resistivity than the NiSi phase.

In one embodiment, a Si/Ni composition close to about 50/50 is used, because NiSi has better contact resistance properties as compared to N$_2$Si or NiS$_2$.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention.

The invention claimed is:

1. A method for forming front side metal contacts of a photovoltaic cell, the method comprising:
   providing a dielectric layer on a textured surface of a silicon substrate, said dielectric layer being a surface passivation layer;
   forming openings through the dielectric layer at predetermined locations where a patterned metal silicide layer needs to be formed;
   providing a metal layer on the silicon substrate, at least at the location of the predetermined openings;
   performing a pulsed laser annealing step providing at least one UN laser pulse with a laser fluence in the range between 0.3 J/cm$^2$ and 0.7 J/cm$^2$ and with a laser pulse duration in the range between 1 ns and 10 ms by using a step-and-scan approach in the pulsed laser annealing step with a small overlapping between each UV laser pulses and using a variable laser beam able to change a laser beam spot size, thereby converting at least part of the metal layer into a metal silicide layer; and
   performing an etching for removing unreacted metal in the metal layer.

2. The method according to claim 1, wherein the laser pulse duration is between 1 ns and 250 ns.

3. The method according to claim 2, wherein the UV laser pulse is provided by an excimer laser.

4. The method according to claim 3, wherein the UV laser pulse has a wavelength of 308 nm.

5. The method according to claim 4, wherein the pulsed laser annealing is performed using an UN laser with the laser beam spot size up to 10 cm×10 cm.

6. The method according to claim 5, wherein the thickness of the metal layer is in the range between 20 nm and 100 nm.

7. The method according to claim 1, wherein the metal layer is provided by plating.

8. The method according to claim 7, wherein the metal layer is provided by Light Induced Plating.

9. The method according to claim 8, wherein forming openings through the dielectric layer comprises forming the openings by means of laser ablation.

10. The method according to claim 8, further comprising:
providing a doped region at the textured surface before providing the dielectric layer, thereby forming a p-n junction.

11. The method according to claim 8, further comprising:
performing a second plating step, thereby forming another metal layer on top of the metal silicide layer.

12. Use of a method according to claim 8 in a process for fabricating a photovoltaic cell, wherein the dielectric layer is an anti reflection coating.

13. The method according to claim 1, wherein the UV laser pulse is provided by an excimer laser.

14. The method according to claim 1, wherein the pulsed laser annealing is performed using an UV laser with the laser beam spot size up to 10 cm×10 cm.

15. The method according to claim 1, wherein the thickness of the metal layer is in the range between 20 nm and 100 nm.

16. The method according to claim 1, wherein the laser fluence is in the range between 0.3 J/cm$^2$ and 0.5 J/cm$^2$.

* * * * *